United States Patent [19]

Moutou et al.

[11] 4,352,115
[45] Sep. 28, 1982

[54] TRANSIT TIME DIODE WITH AN INPUT STRUCTURE FORMED BY A MATRIX OF MICROPOINTS

[75] Inventors: Paul C. Moutou; Jacques Montel, both of Paris, France

[73] Assignee: Thomson-CSF, Paris, France

[21] Appl. No.: 180,979

[22] Filed: Aug. 25, 1980

Related U.S. Application Data

[63] Continuation of Ser. No. 969,314, Dec. 14, 1978, abandoned, which is a continuation of Ser. No. 806,542, Jun. 14, 1977, abandoned.

[30] Foreign Application Priority Data

Jun. 15, 1976 [FR] France .................................. 76 18122

[51] Int. Cl.$^3$ .............................................. H01L 29/90
[52] U.S. Cl. ........................................ 357/13; 357/16; 357/55; 331/107 R
[58] Field of Search ......................... 357/3, 13, 16, 55; 331/107 R

[56] References Cited

U.S. PATENT DOCUMENTS

| | | | |
|---|---|---|---|
| 3,544,854 | 12/1970 | Cox et al. | 357/3 |
| 3,600,705 | 8/1971 | Tantraporn et al. | 357/3 |
| 3,698,941 | 10/1972 | De Nobel et al. | 357/55 |
| 3,706,014 | 12/1972 | Dean | 357/3 |

Primary Examiner—Joseph E. Clawson, Jr.
Attorney, Agent, or Firm—Oblon, Fisher, Spivak, McClelland & Maier

[57] ABSTRACT

A semiconducting diode utilizing the transit time of electrical charge carriers in a semiconductor medium, having an input structure formed by a matrix of micropoints, said matrix consisting of a plurality of microscopic contacts separated by an insulating layer. The diameter of each contact is of the order of 0.5 to 5 micrometers, the distance between the closest contacts being of the order of 0.5 to 15 micrometers. The contacts are made of metal or of an alloy of low resistivity or of a semiconductor material generally doped more heavily than the layer of the semiconductor lying under the microscopic contact. The result of such a structure is an increase in efficiency attributable to the reduction in avalanche voltage or to a better injection by tunnel effect.

1 Claim, 4 Drawing Figures

TRANSIT TIME DIODE WITH AN INPUT STRUCTURE FORMED BY A MATRIX OF MICROPOINTS

This is a continuation of application Ser. No. 969,314, abandoned filed on Dec. 14, 1978, which is a continuation of Ser. No. 806,542, filed June 14, 1977, now abandoned.

This invention relates to semiconducting diodes which utilise the transit time of charge carriers to amplify or generate a high frequency oscillation when a d.c. feed voltage is applied between the two poles of the diode.

Various diode structures which utilise the transit time of charge carriers are known:

1. In the category of so-called "avalanche" diodes (IMPATT diodes):

(a) a structure with a uniform doping profile, successively comprising a junction forming a potential barrier (for example a metal-semiconductor layer), an N-type semiconducting layer with a uniform doping concentration (approximately $2 \cdot 10^{15}$ atoms/cc and an $N^{++}$-type substrate (doping concentration $10^{18}$ atoms/cc);

(b) a structure with a "low-high-low" doping profile which differs from the preceding structure in the existence of an additional, extremely thin layer (approximately 0.1 micron thick) with a fairly high doping concentration ($2 \cdot 10^{17}$ atoms/cc) inserted into the N-layer;

(c) a structure with a "high-low" doping profile which differs from the preceding structure in that the additional layer is inserted against the junction.

2. In the category of so-called "tunnel" effect diodes, a structure successively comprising a layer forming a potential barrier, a very thin, heavily doped layer (doping concentration $2 \cdot 10^{18}$ atoms/cc), then a layer with a medium doping concentration ($2 \cdot 10^{15}$ atoms/cc) and finally the substrate.

All the complementary structures, i.e. structures with inverted N- and P- dopings relative to the above-mentioned structures, are also known and may optionally be used.

The disadvantages of the above-mentioned structures are as follows:

with some, it is the efficiency level, namely the ratio between the power which can be used at ultra-high frequencies and the power taken at the feed source, which is too low (substantially zero for the second category), being limited to a few hundredths of silicon or to 0.15 for gallium arsenide in the case of the diodes of type (a);

for others, it is the difficulty of forming layers with a thickness of less than 1 micron and the critical character of the structure of these layers, particularly in the case of the diodes of type (b).

The present invention aims to obviate these disadvantages by using a matrix of micropoints.

One method of producing a matrix such as this is described in the U.S. patent application filed by Applicants on Jan. 27, 1977, under No. 763,012. This method comprises two main steps:

A. Forming a matrix of microscopic pits on the surface of a semiconductor material, the pits being separated from one another by a layer which prevents the passage of current;

B. Depositing a conductor or semiconductor material in the pits, a supply of conductor material being continued until it forms a single conductive layer covering the matrix of pits and penetrating into the bottom thereof.

It is the pits filled with material which form the matrix of micropoints. The diameter of each pit is, for example, of the order of 0.5 to 5 microns, the distances between the closest pits being of the order of 0.5 to 15 microns. This material may be either a metal or an alloy of low resistivity or a semiconductor material which is generally doped more heavily than the layer which it adjoins.

According to the invention there is provided a transit time diode, comprising an input structure formed by a matrix of micropoints, a junction forming a potential barrier, and a semiconducting layer with a uniform doping concentration.

The invention will be better understood and other features thereof will become apparent from the following description in conjunction with the accompanying drawings, wherein.

Figure 1A:
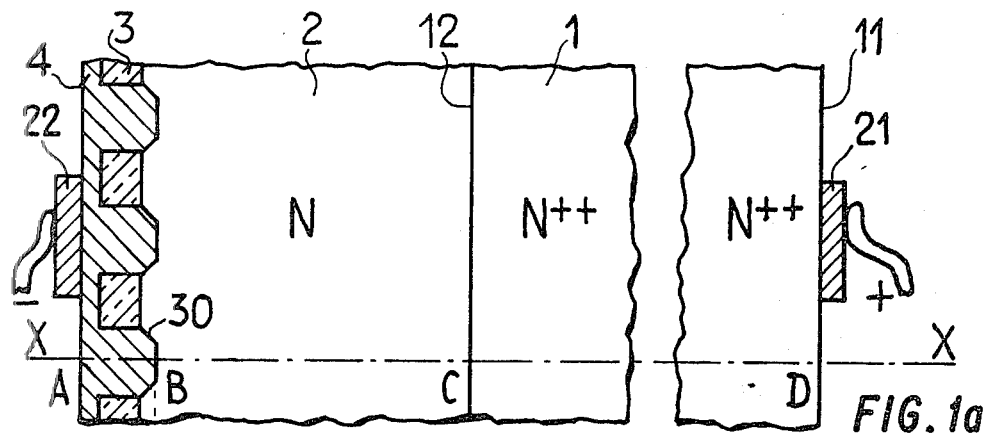
FIG. 1 shows at (a) a cross-section through an avalanche diode structure according to the invention, at (b) the doping profile of this structure and at (c) an electrical field map.
Figure 1B:
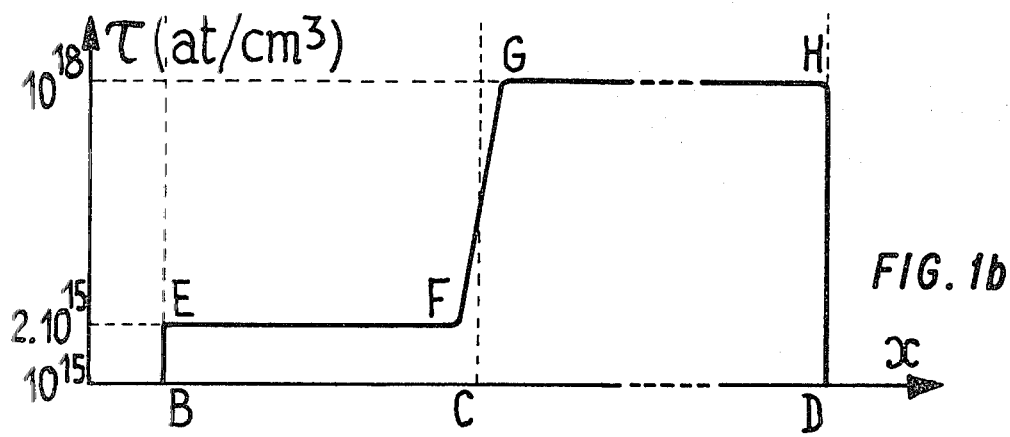
Figure 1C:
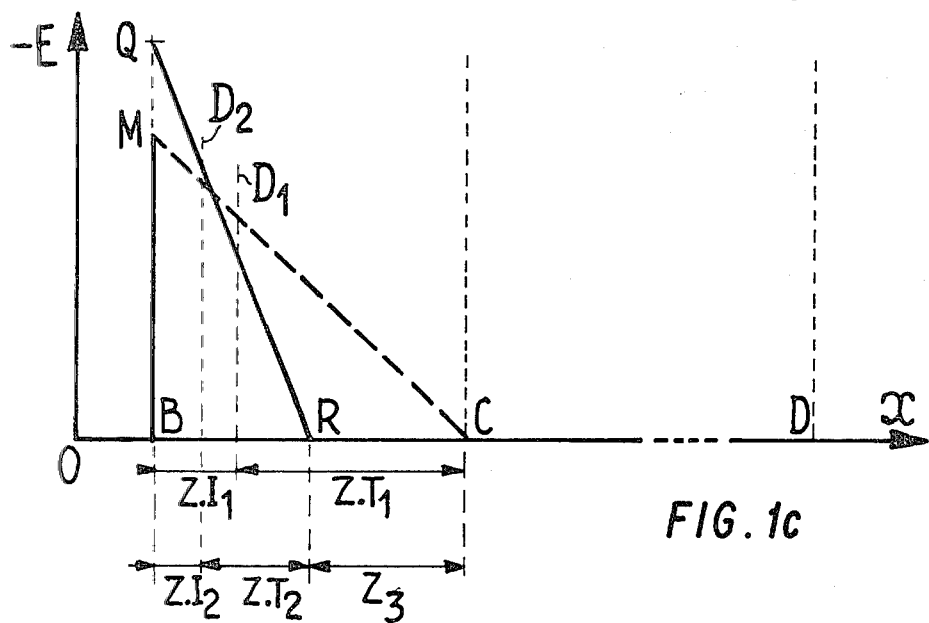

The structure illustrated in FIG. 1 is one example of an avalanche diode with a uniform doping profile of the "N-metal layer/$N^{++}$ substrate" type. According to the invention, this structure comprises a matrix of micropoints at the "metal-semiconductor" junction.

A substrate 1 of semiconductor material with $N^{++}$-doping (doping concentration of $10^{18}$ atoms/cc), for example of monocrystalline silicon or monocrystalline gallium arsenide, forms a volume comprising two parallel surfaces 11 and 12. The surface 11, which forms an input surface for the current (or output surface for the electrons), is provided with a metallisation 21 which is intended to be connected to the positive terminal of a d.c. feed source (not shown). The surface 12 is covered by a monocrystalline layer 2 of N-doped semiconductor material emanating, for example, from an epitaxial growth on the substrate 1. The N-type doping concentration is, for example, $2 \cdot 10^{15}$ atoms/cc. The thickness of the layer 2 is calculated to allow development of the avalanche phenomenon and the transit of electrons over a length corresponding to the desired phase-shift, allowing for the frequency to be amplified or generated.

Using the process described above, that surface of the layer 2 which is opposite the substrate 1 has been covered by a layer 3 of silica from 0.5 to 5 microns thick, followed by the formation of profile pits 30 which penetrate into the layer 2 through the layer of silica. These pits filled with metal (gold or silver) constitute the matrix of micropoints which are interconnected by a layer of metal 4. A metallisation 22 intended to be connected to the negative terminal of the feed source has been deposited onto the layer 4 optionally smoothed by lapping.

At (b), FIG. 1 shows the doping profile of the structure along an axis Ox parallel to the line XX on the plane of FIG. 1 (a) perpendicularly of the surfaces 11 and 12 and passing through a point B of the bottom of a pit 30. A, B, C and D denote four characteristic points of the structure situated on the axis XX. The pure metal is on the segment AB, the n-layer on the segment BC and the $N^{++}$-substrate on the segment CD. These points are marked on the axis Ox and the doping profile EFGH has been drawn, consisting of a plateau EF at $2 \cdot 10^{15}$ atoms/cc and of a plateau GH at $10^{18}$ atoms/cc joined by a very steep slope FG corresponding to the N-N+ *interface*.

At (C), FIG. 1 shows an electrical field map for a bias-E between the electrodes 22 and 21.

The useful portion of the diagram is situated between the abscissae OB and OC (N region). The segment MC, in chain lines, represents the decrease in the modulus of the electrical field in a conventional diode (without micropoints), the straight line $D_1$ representing the boundary between the two zones Z.I. (injection) and $Z.T._1$ (transit) mentioned hereinafter in the description of the operation of the diode. The segment QR in solid lines represents the decrease in the modulus of the electrical field in the diode shown at (a), the straight line $D_2$ and the zones $Z.I._2$ and $Z T_2$ representing the new boundaries and zones of the diode according to the invention. It can be seen that a zero field zone $Z_3$ appears on the segment RC. This zone is redundant and, in practice, it is advisable to eliminate it by reducing the thickness of the layer 2. The thickness of this layer may be adjusted by trial and error by measuring the efficiency of several diode structures differing from one another solely in the thickness of the layer 2.

The operation of a diode of the type in question may be explained in the following manner. It is known that, in an avalanche diode of the transit-time type (so-called "IMPATT" diode), there are two separate zones (in this case in the same layer 2) shown at (c) in FIG. 1:

1. The injection zone (Z.I.) where an ionisation is created by impacts under the effect of the electrons which have crossed the potential barrier placed at B, the avalanche phenomenon taking place from a certain voltage known as the avalanche voltage.

2. The transit zone (Z.T.) traversed by the charge carriers injected from the avalanche zone (in this case the electrons) which travel at the limit velocity in the material under the effect of the electrical field. The thickness of the transit zone is such that the passage time is equal to the required phase-shift between current and voltage to produce an amplification or generation of electrical oscillations at a predetermined frequency.

In the case of the invention, the input junction of the electrons comprises a matrix of micropoints. This results in a contraction by points of the space charge zone which follows the potential barrier formed, for example, by the metal-semiconductor junction. This contraction modifies the distribution of the electrical field and, by point effect, produces a local strengthening of this field. This results in an increase in the ionisation rate at the level of each micropoint and in an increase in the avalanche current and a decrease in the avalanche voltage.

The invention is applicable to tunnel effect diodes. According to one possible explanation, the micropoints promote injection by tunnel effect by the same effect of locally strengthening the electrical field.

Figure 2:
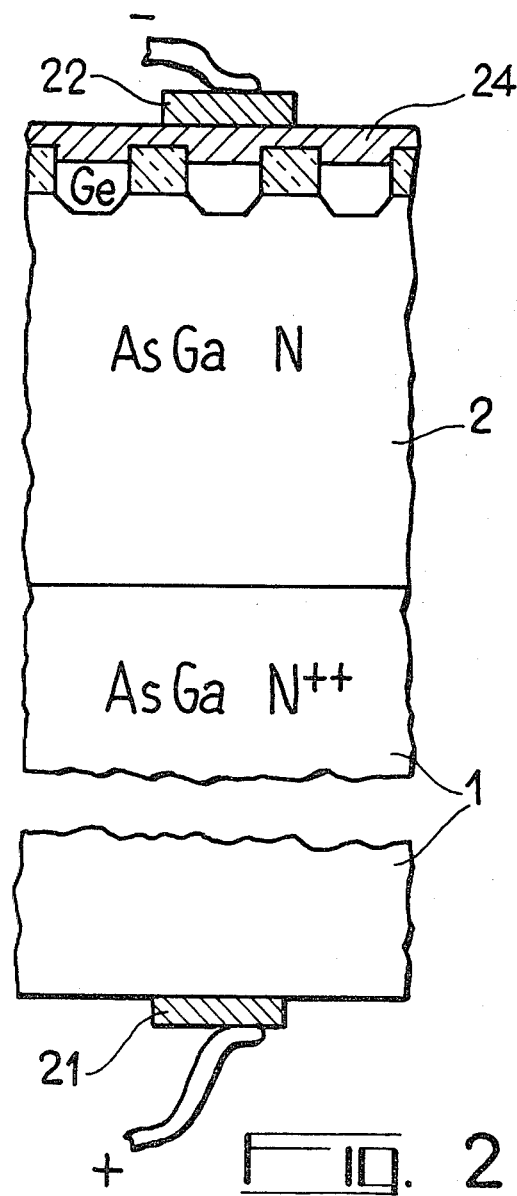
FIG. 2 shows a variant of the invention.

FIG. 2 shows an avalanche diode according to a variant of the invention, wherein the matrix of micropoints comprises a metal layer and points made in part of a semiconductive material more heavily doped than the material of the semiconductive layer of the diode. In the example of FIG. 2, a block of monocrystalline gallium arsenide is divided into two regions: an $N++$-doped substrate 1 and N-doped layer 2. The micropoint structure comprises a matrix of pits incompletely filled with $N+$-doped germanium. The germanium is covered by a metallic layer 24 which overlaps the pits and forms a continuous layer above them.

In this latter case, the presence of metal-gallium arsenide hetero-junctions in the pits increases the discontinuity of the structure at the level of the matrix, which promotes the reduction in the avalanche voltage and the increase in efficiency.

The invention is applicable to any diode structures which utilise the transit time and, in particular, to so-called thermoionic injection diodes of the so-called "BARITT" type.

What we claim is:

1. A transit time diode comprising:
    a substrate of gallium arsenide material with a high $N+$ doping;
    a first layer of gallium arsenide formed on said substrate, said first layer having an N doping less than said $N+$ doping of said substrate and forming a matrix of microscopic pits situated on the side of said first layer opposite to said substrate, said pits having a diameter of 0.5 to 15.0 micrometers;
    a second layer of dielectric material formed on said first layer, said second layer having a matrix of microscopic holes exactly superimposed over said pits;
    a matrix of germanium deposits situated in said pits;
    a third layer of a metal penetrating to said germanium deposits through said holes, and wherein
    said first layer has a predetermined thickness suitable to allow development of the avalanche phenomenon and the transit of electrons over a length corresponding to a desired transit time.

* * * * *